US008803580B2

(12) United States Patent
Shi et al.

(10) Patent No.: US 8,803,580 B2
(45) Date of Patent: Aug. 12, 2014

(54) POWER-ON-RESET (POR) CIRCUIT WITH ZERO STEADY-STATE CURRENT CONSUMPTION AND STABLE PULL-UP VOLTAGE

(75) Inventors: Longxing Shi, Wuxi (CN); Weiwei Shan, Wuxi (CN); Peng Cao, Wuxi (CN); Na Bai, Wuxi (CN); Xuexiang Wang, Wuxi (CN); Tao Zhao, Wuxi (CN)

(73) Assignee: Southeast University, Wuxi, China Jiangsu ( * ) Notice: Subject to any disclaimer, the term of this patent is extended or adjusted under 35 U.S.C. 154(b) by 0 days.

(21) Appl. No.: 13/704,184

(22) PCT Filed: Oct. 17, 2011

(86) PCT No.: PCT/CN2011/080841
§ 371 (c)(1),
(2), (4) Date: Jul. 26, 2013

(87) PCT Pub. No.: WO2012/174810
PCT Pub. Date: Dec. 27, 2012

(65) Prior Publication Data
US 2014/0097873 A1    Apr. 10, 2014

(30) Foreign Application Priority Data

Jun. 21, 2011  (CN) .......................... 2011 1 0166958

(51) Int. Cl.
*H03L 7/00* (2006.01)
*H03K 3/02* (2006.01)

(52) U.S. Cl.
USPC .......................................... 327/198; 327/143

(58) Field of Classification Search
None
See application file for complete search history.

(56) References Cited

U.S. PATENT DOCUMENTS

| 6,879,194 | B1 * | 4/2005 | Caldwell ........................ 327/143 |
| 8,362,814 | B2 * | 1/2013 | Dao et al. ....................... 327/143 |
| 2005/0057287 | A1 * | 3/2005 | Gossmann ..................... 327/143 |
| 2008/0012603 | A1 * | 1/2008 | Wadhwa et al. ................. 327/77 |
| 2010/0156477 | A1 * | 6/2010 | Chellappa ..................... 327/143 |
| 2013/0293273 | A1 * | 11/2013 | Paul ............................. 327/143 |

* cited by examiner

*Primary Examiner* — Tuan T Lam
(74) *Attorney, Agent, or Firm* — Ballard Spahr LLP (57) ABSTRACT

The present invention discloses a Power-On-Reset (POR) circuit with zero steady-state current consumption and stable pull-up voltage. The POR circuit achieves zero steady-state current consumption during steady operation after the POR process by cutting off a power supply to a band-gap comparator circuit and a current comparator circuit after the POR process. The present invention has high reliability and stable pull-up voltage, is less susceptible to the impact of power-on rate of power supply, temperature, and process variation, has very low steady-state power consumption, and can be integrated in a SOC chip in low-power consumption applications.

7 Claims, 4 Drawing Sheets

POWER-ON-RESET (POR) CIRCUIT WITH ZERO STEADY-STATE CURRENT CONSUMPTION AND STABLE PULL-UP VOLTAGE

CROSS-REFERENCE TO RELATED APPLICATIONS

The present invention is a U.S. National Phase application of International Application No. PCT/CN2011/080841, filed Oct. 17, 2011, which claims priority to Chinese Patent Application No. 201110166958.4, filed Jun. 21, 2011, all of which applications are incorporated herein fully by this reference.

FIELD OF THE INVENTION

The present invention relates to a Power-On-Reset (POR) circuit, in particular to a POR circuit with zero steady-state current consumption and stable pull-up voltage, and belongs to the field of integrated circuit technology.

BACKGROUND OF THE INVENTION

As the chip integration level increases, the application of low power techniques in the design of systems on chips (SoCs) increasingly draws the attentions of researchers. As more and more functional modules are integrated in a single chip, the requirement for chip power consumption becomes higher and higher. Especially, the requirement for steady-state power consumption of wireless sensor network node chips becomes rigorous increasingly: the node chips must be able to operate continuously for months or even years; in most of the time, the node chips are in standby or sleep mode; thus, the requirement for steady-state power consumption is very rigorous.

A Power-On-Reset circuit (POR) is an indispensable part of a SoC, and it provides a global reset signal to the system in the initial stage when the entire chip is powered on, to ensure the entire system can start up from a deterministic state; in addition, when the circuit operates normally, system reset will also be induced to prevent the system from operating in an unstable state if the supply voltage drops to an extremely low level. The POR circuit should always be connected to the power supply, no matter whether the system is in the power-up, power-down, or stable stage. Therefore, an extremely low-power consumption but high-performance POR circuit design is of great importance to the SoC chip.

A simple POR circuit is usually implemented by means of the RC charge/discharge principle. When the supply voltage begins to rise, the reset signal is kept at low level since no sudden change of voltage is permitted at both ends of the capacitor C; as the supply voltage charges the capacitor C until the voltage of the upper plate of the capacitor reaches to the threshold voltage of inverter in the next stage, the output of reset signal will quickly change from low to high and keep at high level; thus, the reset process is finished. Though such a POR circuit is simple in structure, the pull-up voltage is unstable, and the large capacitor is difficult to realize inside chips.

SUMMARY

To overcome the drawbacks in the prior art, the present invention provides a POR circuit that has high reliability, stable pull-up voltage, low power consumption, and zero steady-state current consumption.

To attain the object described above, the present invention employs the following technical solution:

The present invention comprises: a power switch, with input terminal connected to the supply voltage; a band-gap comparator circuit, which is connected to output terminal of the power switch and designed to output two channels of current signals according to the variation of supply voltage; a current comparator circuit, which is connected to the output terminal of the band-gap comparator circuit and designed to compare the two channels of current signals and output a voltage detection signal; a state latch circuit, which is connected to the output terminal of the current comparator circuit and designed to latch the voltage detection signal and output a latch signal; an output buffer circuit, which is connected to the output terminal of the state latch circuit and designed to buffer the latch signal, and comprises a first buffer unit and a second buffer unit connected in sequence, wherein, the output terminal of first buffer unit is connected to the power switch, and is designed to control ON/OFF of the power switch, and the second buffer unit outputs a final POR signal; an brown out detector, with the input terminal connected to the supply voltage and the output terminal connected to the output terminal of the state latch circuit, designed to pull down the level at the output terminal of the state latch circuit when it detects the supply voltage is lower than the threshold required for normal operation of the system, so as to reset the system, in order to prevent the system from operating in an unstable state.

The power switch comprises a zeroth P-type CMOS transistor, wherein, the source electrode of the zeroth P-type CMOS transistor is connected to the supply voltage, and the grid electrode of the zeroth P-type CMOS transistor is connected to the output terminal of the first buffer unit.

The band-gap comparator circuit comprises a zeroth NPN-type bipolar transistor, a first NPN bipolar transistor, a first resistor, and a second resistor; wherein, the area of emitting electrode of the zeroth NPN-type bipolar transistor is smaller than the area of emitting electrode of the first NPN-type bipolar transistor; the emitting electrode of the zeroth NPN-type bipolar transistor is grounded, and the collector electrode is connected to the base electrode; the emitting electrode of the first NPN-type bipolar transistor is grounded, and the collector electrode is connected to the base electrode; one terminal of the second resistor is connected to the drain electrode of the zeroth P-type CMOS transistor, and the other terminal of the second resistor is connected to the collector electrode of the zeroth NPN-type bipolar transistor; one terminal of the first resistor is connected to the base electrode of the zeroth NPN-type bipolar transistor, and the other terminal of the first resistor is connected to the base electrode of the first NPN-type bipolar transistor.

The current comparator circuit comprises a third current mirror, a fourth P-type CMOS transistor, a fifth N-type CMOS transistor, a sixth P-type CMOS transistor, and a transmission gate; the third current mirror comprises a third P-type CMOS transistor, a fourth NPN-type bipolar transistor, and a fifth NPN-type bipolar transistor; the source electrodes of the third P-type CMOS transistor, fourth P-type CMOS transistor, and sixth P-type CMOS transistor are connected to the drain electrode of the zeroth P-type CMOS transistor respectively; the drain electrode of the fourth P-type CMOS transistor is connected is connected to the grid electrode; the grid electrode of the third P-type CMOS transistor is connected to the common terminal between the grid electrode and the drain electrode of the second P-type CMOS transistor, and the drain electrode of the third P-type CMOS transistor is connected to the collector electrode of the fourth NPN-type bipolar transistor and the grid electrode of the fifth N-type CMOS transistor; the base electrode of the fourth NPN-type bipolar transistor is connected to the collector electrode of the zeroth NPN-type bipolar transistor, and the emitting electrode of the fourth NPN-type bipolar transistor is grounded; the base electrode of the fifth NPN-type bipolar transistor is connected to the base electrode of the fourth NPN-type bipolar transistor, the source electrode of the fifth NPN-type bipolar transistor is grounded, and the collector electrode of the fifth NPN-type bipolar transistor is connected to the common terminal between the drain electrode and the grid electrode of the fourth P-type CMOS transistor; the grid electrode of the sixth P-type CMOS transistor is connected to the common terminal between the drain electrode and the grid electrode of the fourth P-type CMOS transistor, the drain electrode of the sixth P-type CMOS transistor is connected to the drain electrode of the fifth N-type CMOS transistor and to one terminal of the transmission gate; the source electrode of the fifth N-type CMOS transistor is grounded.

The state latch circuit comprises a zeroth capacitor, a latch ring, a fourth inverter, a fifth inverter, a sixth inverter, a first inverter, and a fourteenth P-type CMOS transistor; wherein, one pole of the zeroth capacitor is connected to the supply voltage, and the other pole of the zeroth capacitor is connected to the input terminal of the fourth inverter and the input terminal of the latch ring respectively; the output terminal of the fourth inverter is connected to the input terminal of the fifth inverter, the output terminal of the fifth inverter is connected to the input terminal of the sixth inverter, the output terminal of the sixth inverter is connected to the grid electrode of the fourteenth P-type CMOS transistor; the drain electrode of the fourteenth P-type CMOS transistor is connected to the other terminal of the transmission gate, and the source electrode of the fourteenth P-type CMOS transistor is connected to the input terminal of the first inverter; the output terminal of the latch ring is connected to the input terminal of the first buffer unit; the output terminal of the first inverter is connected to the input terminal of the latch ring.

The brown out detector comprises a ninth P-type CMOS transistor, a tenth N-type CMOS transistor, an eleventh N-type CMOS transistor, a twelfth N-type CMOS transistor, a thirteenth P-type CMOS transistor, and a second capacitor; wherein, the source electrode of the thirteenth P-type CMOS transistor is connected to the supply voltage, and the common terminal between the grid electrode and the drain electrode of the thirteenth P-type CMOS transistor is connected to one pole of the second capacitor and the source electrode of the ninth P-type CMOS transistor; the ninth P-type CMOS transistor and the tenth N-type CMOS transistor constitute an inverter, and the source electrode of the tenth N-type CMOS transistor and the other pole of the second capacitor are grounded; one terminal of the inverter is connected to the supply voltage, and the other terminal of the inverter is connected to the grid electrode of the eleventh N-type CMOS transistor and the grid electrode of the twelfth N-type CMOS transistor; the source electrode of the eleventh N-type CMOS transistor is grounded, and the drain electrode of the eleventh N-type CMOS transistor is connected to the output terminal of the latch ring; the source electrode of the twelfth N-type CMOS transistor is grounded, and the drain electrode of the twelfth N-type CMOS transistor is connected to the source electrode of the fourteenth P-type CMOS transistor.

The latch ring comprises a second inverter and a third inverter; wherein, the output terminal of the second inverter is connected to the input terminal of the third inverter, and the output terminal of the third inverter is connected to the input terminal of the second inverter.

The present invention has a simple but novel structure, high reliability and stable pull-up voltage, is less susceptible to the impact of power-on rate of power supply, temperature, and process variation, has very low steady-state power consumption, and can be integrated in a SOC chip in low-power consumption applications.

BRIEF DESCRIPTION OF THE DRAWINGS

Hereunder the present invention will be detailed in embodiments, with reference to the accompanying drawings.

DETAILED DESCRIPTION OF THE EMBODIMENTS

To make the technical means, creative features, and attained object and efficacy of the present invention understood more clearly, hereunder the present invention will be detailed in some embodiments.

Figure 1:
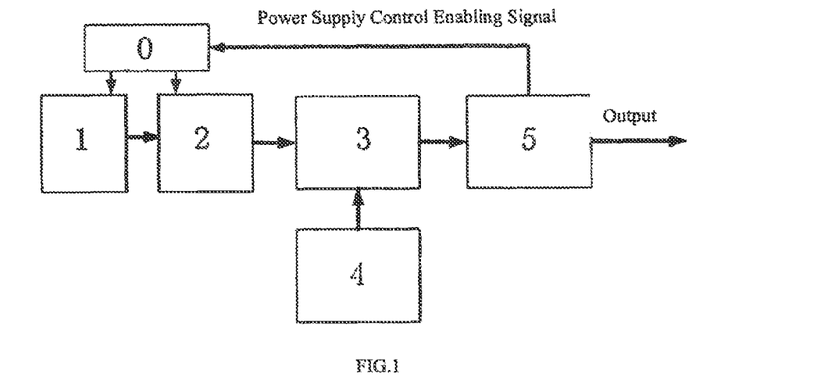
FIG. 1 is a structural block diagram of the present invention.
Figure 2:
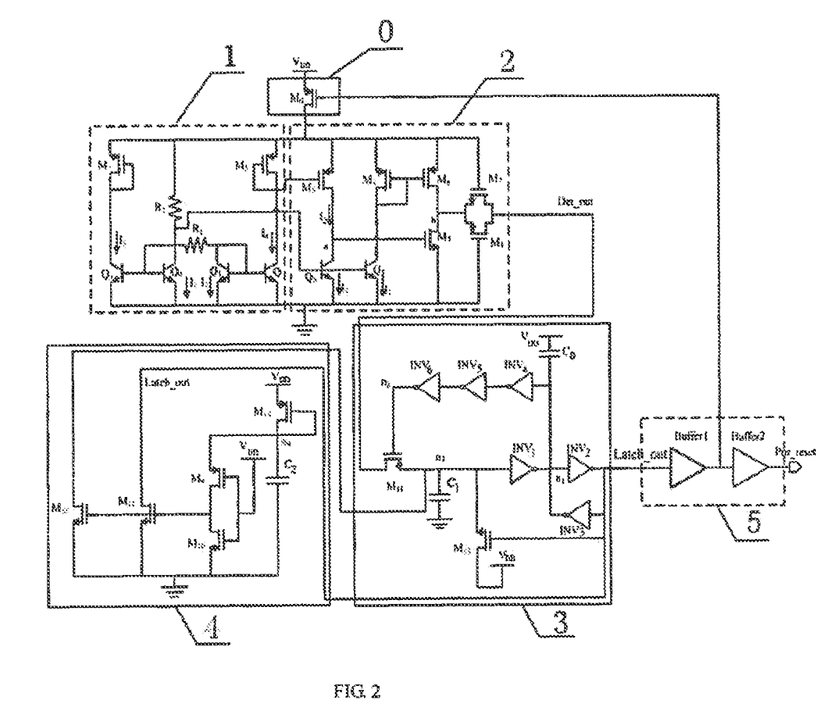
FIG. 2 is a schematic circuit diagram of FIG. 1.

Please see FIGS. 1 and 2. The present invention comprises a power switch 0, a band-gap comparator circuit 1, a current comparator circuit 2, a state latch circuit 3, a brown out detector 4, and an output buffer circuit 5.

The input terminal of the power switch 0 is connected to the supply voltage, the output terminal of the power switch 0 is connected to the input terminal of the band-gap comparator circuit 1, the output terminal of the band-gap comparator circuit 1 is connected to the input terminal of the current comparator circuit 2, the output terminal of the current comparator circuit 2 is connected to the input terminal of the state latch circuit 3, the input terminal of the brown out detector 4 is connected to the supply voltage, the output terminal of the brown out detector 4 is connected to the output terminal of the state latch circuit 3, the output terminal of the state latch circuit 3 is connected to the input terminal of the output buffer circuit 5; the output buffer circuit 5 comprises a first buffer unit Buffer1 and a second buffer unit Buffer2 connected in sequence, wherein, the first buffer unit Buffer1 sends a power supply control enabling signal to the power switch 0, so as to control ON/OFF of the power switch 0 and thereby control the operating state of the band-gap comparator circuit 1 and the current comparator circuit 2; the second buffer unit Buffer2 outputs a final POR signal Por_reset.

The working process of the present invention is as follows:

The band-gap comparator circuit 1 and the current comparator circuit 2 output a voltage detection signal Det_out, voltage detection signal Det_out is input to the state latch circuit 3, the state latch circuit 3 latches the voltage detection signal Det_out and outputs a latch signal Latch_out; if the supply voltage is higher than the pull-up voltage, the output buffer circuit 5 will output a final POR signal Por_reset, and cut off the power switch 0 (i.e., cut off the working power supply of the band-gap comparator circuit 1 and the current comparator circuit 2).

When the brown out detector 4 detects that the supply voltage is lower than the threshold required for normal operation of the system, it will pull down the level at the output terminal of the state latch circuit 3 to reset the system (reset at low level), and switch on the power switch 0 (so that the band-gap comparator circuit 1 and current comparator circuit 2 start to work again), and thereby the POR process will start again.

The reset signal comprises a process from low level to high level; when the reset signal is at high level, it indicates the reset process is finished.

The power switch 0 comprises a zeroth P-type CMOS transistor M0, wherein, the source electrode of the zeroth P-type CMOS transistor M0 is connected to the supply voltage, and the grid electrode of the zeroth P-type CMOS transistor M0 is connected to the output terminal of the first buffer unit Buffer1.

Figure 3:
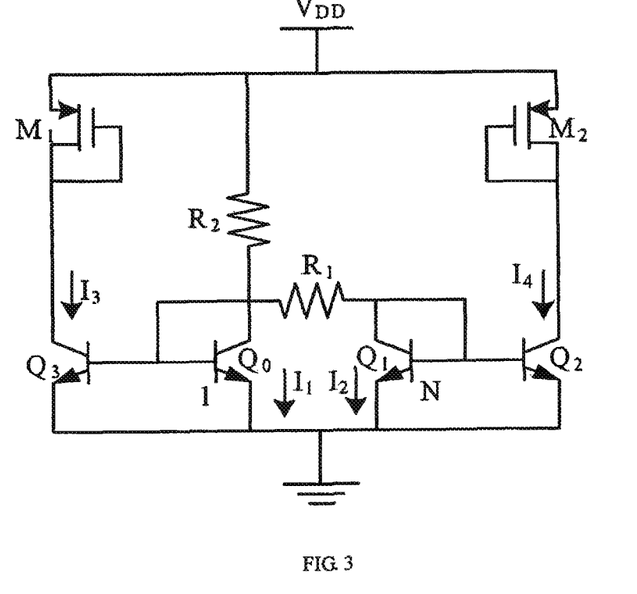
FIG. 3 is a circuit diagram of the band-gap comparator circuit in the present invention.

Please see FIG. 3. The band-gap comparator circuit 1 outputs two channels of current signals to the current comparator circuit 2, according to the voltage variation signal of the external power supply $V_{DD}$ and the power control enabling signal fed back from the output buffer circuit 5. This circuit utilizes the characteristics of several NPN transistors with fixed and grounded emitting electrode in the CMOS technique to achieve stable pull-up voltage with a low temperature coefficient.

The pull-up voltage generated by the band-gap comparator circuit 1 has a low temperature coefficient, and therefore is less susceptible to the impact on of the manufacturing process of the components.

The band-gap comparator circuit 1 in the present invention comprises a first current mirror, a second current mirror, a first resistor R1, and a second resistor R2. Wherein, the first current mirror comprises a zeroth NPN-type bipolar transistor Q0, a third NPN-type bipolar transistor Q3, and a first P-type CMOS transistor M1; the second current mirror comprises a first NPN-type bipolar transistor Q1, a second NPN-type bipolar transistor Q2, and a second P-type CMOS transistor M2.

The area of emitting electrode of the zeroth NPN-type bipolar transistor Q0 is smaller than the area of emitting electrode of the first NPN-type bipolar transistor Q1.

The source electrode of the first P-type CMOS transistor M1 is connected to the drain electrode of the zeroth P-type CMOS transistor M0, and the grid electrode and the drain electrode of the first P-type CMOS transistor M1 is connected; the collector electrode of the third NPN-type bipolar transistor Q3 is connected to the common terminal between the grid electrode and the drain electrode of the first P-type CMOS transistor M1, the emitting electrode of the third NPN-type bipolar transistor Q3 is grounded, and the base electrode of the third NPN-type bipolar transistor Q3 is connected to the base electrode of the zeroth NPN-type bipolar transistor Q0; the emitting electrode of the zeroth NPN-type bipolar transistor Q0 is grounded.

The source electrode of the second P-type CMOS transistor M2 is connected to the drain electrode of the zeroth P-type CMOS transistor M0, and the gate terminal and the drain terminal of the second P-type CMOS transistor M2 is connected; the collector electrode of the second NPN-type bipolar transistor Q2 is connected to the common terminal between the grid electrode and the drain electrode of the second P-type CMOS transistor M2, the emitting electrode of the second NPN-type bipolar transistor Q2 is grounded, and the base electrode of the second NPN-type bipolar transistor Q2 is connected to the base electrode of the first NPN-type bipolar transistor Q1; the emitting electrode of the first NPN-type bipolar transistor Q1 is grounded, the collector electrode and the base electrode of the first NPN bipolar transistor Q1 is connected.

One terminal of the second resistor R2 is connected to the drain electrode of the zeroth P-type CMOS transistor M0, and the other terminal is connected to the collector electrode of the zeroth NPN-type bipolar transistor Q0; one terminal of the first resistor R1 is connected to the common terminal between the base electrode of the third NPN-type bipolar transistor Q3 and the base electrode of the zeroth NPN-type bipolar transistor Q0, and the other terminal of the first resistor R1 is connected to the common terminal between the base electrode of the first NPN-type bipolar transistor Q1 and the base electrode of the second NPN-type bipolar transistor Q2.

The working principle of the band-gap comparator circuit 1 is as follows:

In the variation process that the supply voltage $V_{DD}$ rises up from 0, when the supply voltage $V_{DD}$ is low, the P-N junction of the zeroth NPN-type bipolar transistor Q0 has not turned on; since the area of emitting electrode of the first NPN-type bipolar transistor Q1 is N times of the area of emitting electrode of the zeroth NPN-type bipolar transistor Q0, the second current $I_2$ is higher than the first current $I_1$ at the moment.

When the P-N junction of the zeroth NPN-type bipolar transistor Q0 turns on as the supply voltage $V_{DD}$ rises further, the voltage difference $V_{BE0}$ between the base electrode and the emitting electrode of the zeroth NPN-type bipolar transistor Q0 is equal to the voltage $V_{R1}$ across $R_1$ plus the voltage difference $V_{BE1}$ between the base electrode and the emitting electrode of the first NPN-type bipolar transistor Q1, i.e., $V_{BE0}=V_{R1}+V_{BE1}$, which is to say, $V_{BE0}>V_{BE1}$; therefore, $I_2$ is lower than $I_1$.

Therefore, utilizing the variation pattern of the two channels of current in the circuit, whether the supply voltage $V_{DD}$ has reached to the pull-up voltage $V_{TP}$ for power-on reset can be judged by comparing the amplitudes of the two channels of current; that is, when $I_2$ is higher than $I_1$, it indicates the supply voltage $V_{DD}$ has not reached to the pull-up voltage $V_{TP}$ yet; when $I_2$ is equal to $I_1$, it indicates the critical condition is reached, and the supply voltage $V_{DD}$ has reached to the pull-up voltage $V_{TP}$; when $I_2$ is lower than $I_1$, the circuit will output a POR signal Por_reset.

When the POR circuit operates normally, the following expression of pull-up voltage $V_{TP}$ can be obtained:

$$V_{TP} = V_T \frac{2R_2}{R_1}\ln N + V_T \ln \frac{V_T \ln N}{R_1} - V_T \ln(C_0 T^\alpha) + V_g$$

Where, $C_0$ is the diffusion coefficient, $\alpha$ is a constant, N is the area ratio of the emitting electrode of the first NPN-type bipolar transistor Q1 to the emitting electrode of the zeroth NPN-type bipolar transistor Q0, $V_g$ is the band-gap voltage, $V_T=kT/q$, k is the Boltzmann constant, q is the electron charge, and T is the temperature.

The following expression can be obtained by taking the derivative of the pull-up voltage $V_{TP}$:

$$dV_{TP}/d_r = \frac{k}{q}\left(\frac{2R_2}{R_1}\ln N + 1 - \alpha + \ln \frac{kT}{q} \frac{\ln N}{R_1} - \ln(C_0 T^\alpha)\right)$$

The impact of temperature variation on the pull-up voltage of the circuit in the vicinity of this temperature can be minimized, by regulating the first resistor $R_1$ and the second resistor $R_2$ till the derivative of the pull-up voltage $V_{TP}$ is zero.

Figure 4:
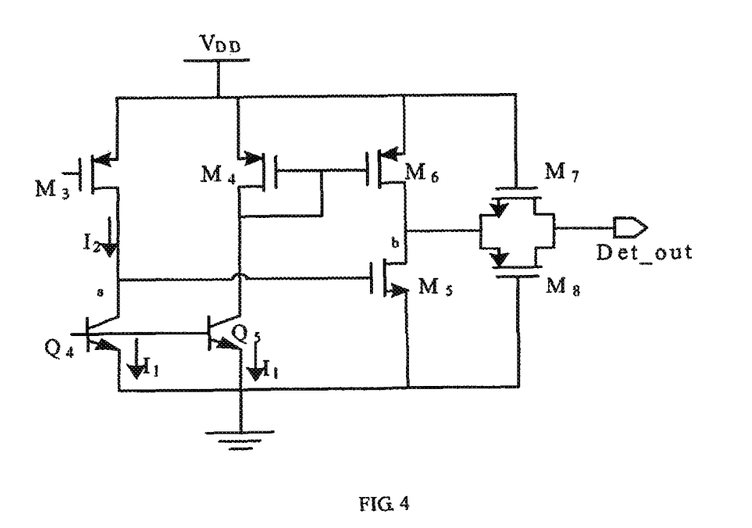
FIG. 4 is a circuit diagram of the current comparator circuit in the present invention.

Please see FIG. 4. The current comparator circuit 2 outputs high level or low level accordingly by comparing the image current in the two branches of the band-gap comparator circuit 1, and thereby outputs a POR voltage detection signal Det_out to the state latch circuit 3.

The current comparator circuit 2 in the present invention comprises a third current mirror, a fourth P-type CMOS transistor M4, a fifth N-type CMOS transistor M 5, a sixth P-type CMOS transistor M6, and a transmission gate. The third current mirror comprises a third P-type CMOS transistor M3, a fourth NPN-type bipolar transistor Q4, and a fifth NPN-type bipolar transistor Q5.

The source electrodes of the third P-type CMOS transistor M3, the fourth P-type CMOS transistor M4, and the sixth P-type CMOS transistor M6 are connected to the drain electrode of the zeroth P-type CMOS transistor M0 respectively; the drain electrode and the grid electrode of the fourth P-type CMOS transistor M4 is connected; the grid electrode of the third P-type CMOS transistor M3 is connected to the common terminal between the grid electrode and the drain electrode of the second P-type CMOS transistor M2, the drain electrode of the third P-type CMOS transistor M3 is connected to the collector electrode of the fourth NPN-type bipolar transistor Q4 and the grid electrode of the fifth N-type CMOS transistor M5 respectively; the base electrode of the fourth NPN-type bipolar transistor Q4 is connected to the collector electrode of the zeroth NPN-type bipolar transistor Q0, and the emitting electrode of the fourth NPN-type bipolar transistor Q4 is grounded; the base electrode of the fifth NPN-type bipolar transistor Q5 is connected to the base electrode of the fourth NPN-type bipolar transistor Q4, the source electrode of the fifth NPN-type bipolar transistor Q5 is grounded, and the collector electrode of the fifth NPN-type bipolar transistor Q5 is connected to the common terminal between the drain electrode and the grid electrode of the fourth P-type CMOS transistor M4; the grid electrode of the sixth P-type CMOS transistor M6 is connected to the common terminal between the drain electrode and the grid electrode of the fourth P-type CMOS transistor M4, and the drain electrode of the sixth P-type CMOS transistor M6 is connected to the drain electrode of the fifth N-type CMOS transistor M5 and one terminal of the transmission gate; the source electrode of the fifth N-type CMOS transistor M5 is grounded.

In the band-gap comparator circuit 1, the zeroth NPN-type bipolar transistor Q0 and first NPN-type bipolar transistor Q1 correspond to the branch circuit $I_1$ and $I_2$ respectively, and mirror to the current comparator circuit 2 via the third current mirror; while $I_2$ is lower than $I_1$, the current comparator circuit 2 outputs a voltage detection signal Det_out.

The working principle of the current comparator circuit 2 is as follows:

The circuit obtains the image current from the band-gap comparator circuit 1 via the third current mirror. When the supply voltage $V_{DD}$ begins to power on, the supply voltage $V_{DD}$ is lower than the pull-up voltage $V_{TP}$, and therefore the current $I_2$ is higher than the current $I_1$, and the node a is charged and its potential rises; consequently, the fifth N-type CMOS transistor M5 turns on; at the time, since the current $I_1$ is very low, the sixth P-type CMOS transistor M6 is in cut-off state, and point b is at low level; thus, low level is outputted from the transmission gate constituted by the seventh N-type CMOS transistor M7 and the eighth P-type CMOS transistor M8; when $I_1=I_2$ as the supply voltage $V_{DD}$ rises further, the circuit enters into a balanced state; at this moment, the supply voltage $V_{DD}$ is equal to the pull-up voltage $V_{TP}$ of the circuit; when the supply voltage $V_{DD}$ exceeds the pull-up voltage $V_{TP}$, the current $I_2$ will be lower than the current $I_1$, and the potential at node a will be pulled down to low level; consequently, the fifth N-type CMOS transistor M5 turns off and the sixth P-type CMOS transistor M6 turns on at this time; thus, the circuit outputs a high level signal, i.e., the voltage detection signal Det_out.

Therefore, when the supply voltage $V_{DD}$ rises from 0, Det_out will keep at 0 initially; when the supply voltage $V_{DD}$ rises to the pull-up voltage $V_{TP}$, Det_out will rise.

Figure 5:
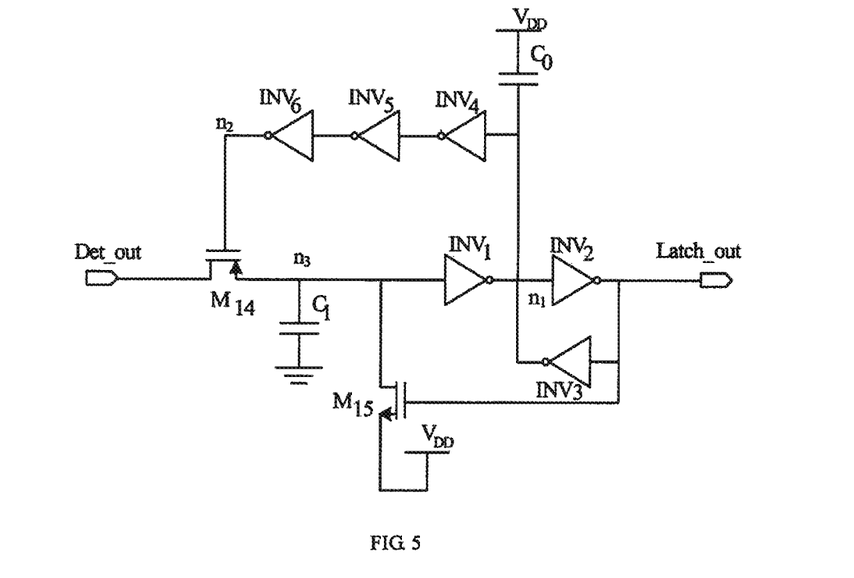
FIG. 5 is a circuit diagram of the state latch circuit in the present invention.

Please see FIG. 5. The state latch circuit 3 receives a voltage detection signal Det_out from the current comparator circuit 2, latches the voltage detection signal Det_out, and outputs a latch signal Latch_out to the output buffer circuit 5. For more information on the state latch circuit 3, please see the reference document: S. K. Wadhwa, et al. Zero steady state current power-on-reset circuit with Brown-out detector [C]. Proceedings of the IEEE International Conference on VLSI Design, 2006: 631-636.

The state latch circuit 3 in the present invention comprises a zeroth capacitor C0, a latch ring, a fourth inverter INV4, a fifth inverter INV5, a sixth inverter INV6, a first inverter INV1, a fourteenth P-type CMOS transistor M14, a first capacitor C1, and a fifteenth N-type CMOS transistor M15.

One pole of the zeroth capacitor C0 is connected to the supply voltage, and the other pole of the zeroth capacitor C0 is connected to the input terminal of the fourth inverter INV4 and the input terminal of the latch ring respectively; the output terminal of the fourth inverter INV4 is connected to the input terminal of the fifth inverter INV5, the output terminal of the fifth inverter INV5 is connected to the input terminal of the sixth inverter INV6, and the output terminal of the sixth inverter INV6 is connected to the grid electrode of the fourteenth P-type CMOS transistor 14; the drain electrode of the fourteenth P-type CMOS transistor M14 is connected to the other terminal of the transmission gate, and the source electrode of the fourteenth P-type CMOS transistor M14 is connected to one pole of the first capacitor C1, the input terminal of the first inverter INV1, and the source electrode of the fifteenth N-type CMOS transistor M15 respectively; the other pole of the first capacitor C1 is grounded; the drain electrode of the fifteenth N-type CMOS transistor M15 is connected to the supply voltage, the grid electrode of the fifteenth N-type CMOS transistor M15 is connected to the output terminal of the latch ring, and the output terminal of the latch ring is connected to the input terminal of the first buffer unit Buffer1; the output terminal of the first inverter INV1 is connected to the input terminal of the latch ring.

The working principle of the state latch circuit 3 is as follows:

The main component of the state latch circuit 3 is a latch ring constituted by the second inverter INV2 and the third inverter INV3, with the input terminal of the latch ring connected to the supply voltage $V_{DD}$ via the zeroth capacitor C0.

The state latch circuit 3 has two working states: first, in the initial stage of power-on, as the supply voltage $V_{DD}$ rises, the voltage at node n1 will rise accordingly, since the voltage difference across the zeroth capacitor C0 remains unchanged. In the circuit, the swithcing threshold of the second inverter INV2 and the fourth inverter INV4 is designed to a low value; via the fifth inverter INV5 and the sixth inverter INV6, the voltage at the node n2 is low, and therefore the fourteenth P-type CMOS transistor M14 is in ON state, and latches a low-level Det_out signal as the global reset signal for the chip.

Next, when the supply voltage $V_{DD}$ exceeds the pull-up voltage $V_{TP}$ of the POR circuit, the Det_out signal will rise from 0, and will increase as the supply voltage $V_{DD}$ increases. Since the fourteenth P-type CMOS transistor M14 is still in ON state at this time, the voltage at node n1 will be pulled down, and the Latch_out signal will increase. As the voltage at the node n1 decreases, the gate voltage of the fourteenth P-type CMOS transistor M14 will increase and therefore the fourteenth P-type CMOS transistor M14 will turn off; consequently, the circuit in the preceding stage is isolated from the state latch circuit 3. After some delay time, the Latch_out signal turns off the zeroth P-type CMOS transistor M0, and therefore the power supply of the band-gap comparator circuit 1 and current comparator circuit 2 is cut off; consequently, their power consumption in steady state is zero.

The above circuit has the following problem: since the node n3 is floated due to the cut-off of the fourteenth P-type CMOS transistor M14 after the POR process is finished, the state latch circuit 3 will discharge slowly by means of the leak current from the fourteenth P-type CMOS transistor M14; once the voltage at the node n3 is lower than the switching threshold of the first inverter INV1, the voltage at the node n1 will rise, and thereby the Latch_out voltage will decrease; as a result, the circuit will be reset in a wrong way. To prevent such a situation, a fifteenth N-type CMOS transistor M15 is added, so that the Latch_out is high after the POR process is finished, and will force the fifteenth N-type CMOS transistor M15 to turn on and the voltage at node n3 will be fixed to high level; thereby the output voltage will be at high level.

The output buffer circuit 5 is designed to buffer the inputted latch signal Latch_out and output the final POR signal Por_reset; meanwhile, it sends a power supply control enabling signal to the power switch 3 to control ON/OFF of the power switch 3, and thereby control the operating state of the band-gap comparator circuit 1 and current comparator circuit 2.

Figure 6:
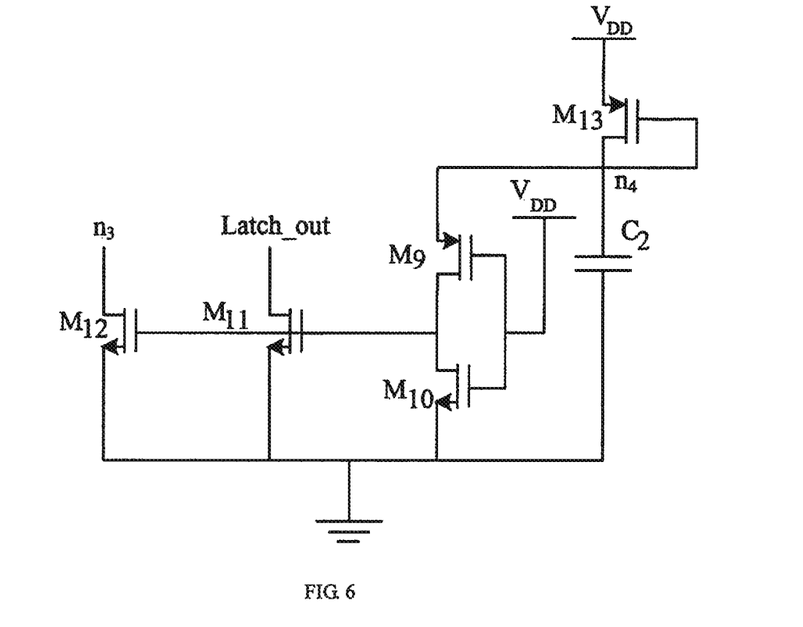
FIG. 6 is a circuit diagram of the brown out detector in the present invention.

Please see FIG. 6, the brown out detector 4 outputs a reset signal to the output terminal of the state latch circuit 3 to reset the system when the supply voltage $V_{DD}$ is lower than the threshold required for normal operation of the system according to voltage variation signal of external power supply, so as to prevent the system from operating in an unstable state. Please see the reference document: S. K. Wadhwa, et al. Zero steady state current power-on-reset circuit with Brown-out detector[C]. Proceedings of the IEEE International Conference on VLSI Design, 2006: 631-636.

The brown out detector 4 in the present invention comprises a ninth P-type CMOS transistor M9, a tenth N-type CMOS transistor M10, an eleventh N-type CMOS transistor M11, a twelfth N-type CMOS transistor M12, a thirteenth P-type CMOS transistor M13, and a second capacitor C2.

The source electrode of the thirteenth P-type CMOS transistor M13 is connected to the supply voltage, and the common terminal between the grid electrode and the drain electrode of the thirteenth P-type CMOS transistor M13 is connected to one pole of the second capacitor C2 and the source electrode of the ninth P-type CMOS transistor M9; the ninth P-type CMOS transistor M9 and the tenth N-type CMOS transistor M10 constitute an inverter, and the source electrode of the tenth N-type CMOS transistor M10 and the other terminal of the second capacitor C2 are grounded; one terminal of the inverter is connected to the supply voltage, and the other terminal of the inverter is connected to the grid electrode of the eleventh N-type CMOS transistor M11 and the grid electrode of the twelfth N-type CMOS transistor M12; the source electrode of the eleventh N-type CMOS transistor Mil is grounded, and the drain electrode of the eleventh N-type CMOS transistor M11 is connected to the output terminal of the latch ring; the source electrode of the twelfth N-type CMOS transistor M12 is grounded, and the drain electrode of the twelfth N-type CMOS transistor M12 is connected to the source electrode of the fourteenth P-type CMOS transistor M14.

The working principle of the brown out detector 4 is as follows:

It utilizes the voltage temporarily stored in the second capacitor C2 to provide power supply to the inverter constituted by the ninth P-type CMOS transistor M9 and the tenth N-type CMOS transistor M10. The thirteenth P-type CMOS transistor M13 in the circuits is connected to the second capacitor C2 in a diode connection manner.

When the supply voltage $V_{DD}$ rises to high voltage, the voltage at the node n4 will be $V_{DD}-V_{th}$, where, $V_{th}$ is the threshold voltage of the thirteenth P-type CMOS transistor M13; at this moment, this part of circuit has no direct current path from the power supply to the ground, and therefore the power consumption in steady state is zero.

When the supply voltage $V_{DD}$ drops to be lower than the voltage at the node n4, the thirteenth P-type CMOS transistor M13 will turn off; under the action of the second capacitor C2, the node n4 will remain at the high voltage $V_{DD}-V_{th}$ before power off. As the voltage $V_{DD}$ drops further, the high voltage outputted via the inverter will cause the eleventh N-type CMOS transistor M11 and the twelfth N-type CMOS transistor M12 to turn on; consequently, the potential at the node n4 and the potential of Latch_out will be changed, the Latch_out voltage will be pulled down, and thereby the circuit will be reset again. Meanwhile, the zeroth P-type CMOS transistor M0 in the circuit will also be switched on, and the band-gap comparator circuit 1 and current comparator circuit 2 will restart.

Figure 7:
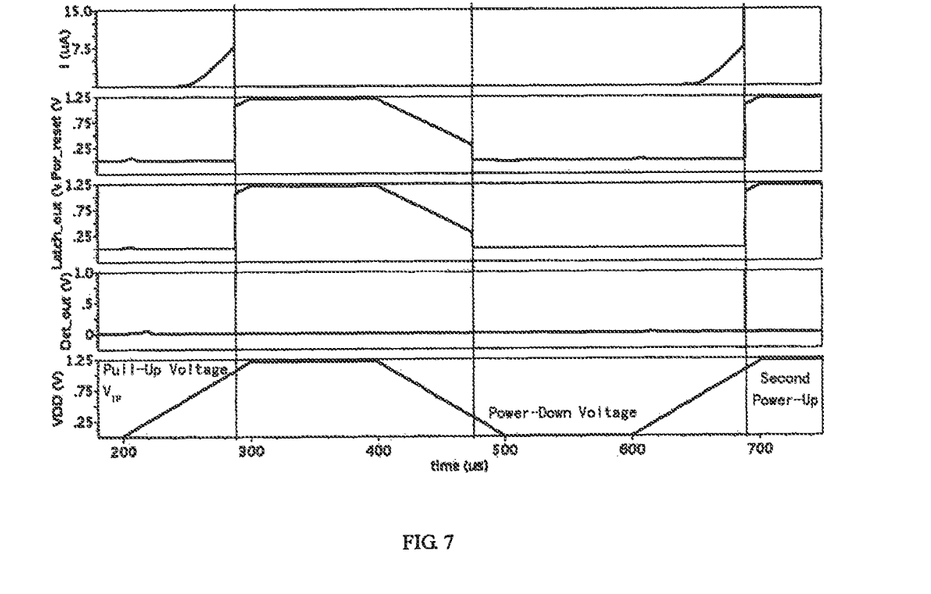
FIG. 7 is a waveform schematic diagram of several signals in the power-on reset process of the circuit in the present invention.

Please see FIG. 7. When the supply voltage $V_{DD}$ rises to the pull-up voltage $V_{TP}$, a Por_reset signal will be generated, and the signal Det_out will be cut off timely and latched by means of the Latch_out. When the supply voltage $V_{DD}$ drops to a specific value, the POR circuit will generate a low-level reset signal Por_reset. As the supply voltage $V_{DD}$ rises again, Por_reset will rise, and the reset process will be finished.

In the circuit provided in the present invention, the steady-state current after the POR process is finished and the circuit becomes stable will be only tiny drain current at picoampere level, with the exception to the current consumption at the level of several microamperes in the process that the voltage $V_{DD}$ rises from 0 to the pull-up voltage and the pulse current consumption at the level of several microamperes in a very short time period after the Det_out signal is generated; therefore, the requirement for zero steady-state current consumption in POR is achieved.

The basic principle, main features, and advantages of the present invention are described and illustrated above. Those skilled in the art should appreciate that the present invention is not limited to the embodiments. What is described in the above embodiments and description is only the principle of the present invention, and various alternations and modifications can be made to the present invention without departing from the spirit and scope of the present invention; however, such alternations and modifications shall be deemed as falling into the protection scope of the present invention. The protection scope of the present invention shall be only confined by the claims and their equivalents.

The invention claimed is:

1. A Power-On Reset (POR) circuit with zero steady-state current consumption and stable pull-up voltage, comprising:
   a power switch (0), with the input terminal connected to the supply voltage;
   a band-gap comparator circuit (1), which is connected to the output terminal of the power switch (0), and configured to output two channels of current signals according to a variation signal of the supply voltage;
   a current comparator circuit (2), which is connected to the output terminal of the band-gap comparator circuit (1), and configured to compare the two channels of current signals and output a voltage detection signal;
   a state latch circuit (3), which is connected to the output terminal of the current comparator circuit (2), and configured to latch the voltage detection signal and output a latch signal;
   an output buffer circuit (5), which is connected to the output terminal of the state latch circuit (3), and configured to buffer the latch signal, wherein, the output buffer circuit (5) comprises a first buffer unit and a second buffer unit connected in sequence, the output terminal of the first buffer unit is connected to the power switch (0) and configured to control ON/OFF of the power switch (0), the second buffer unit outputs a final Power-On Reset signal;
   a brown out detector (4), with the input terminal connected to the supply voltage and the output terminal connected to the output terminal of the state latch circuit (3), configured to pull down the level at the output terminal of the state latch circuit (3) so as to reset the system when it detects the supply voltage is lower than the threshold required for normal operation of the system.

2. The POR circuit with zero steady-state current consumption and stable pull-up voltage according to claim 1, wherein, the power switch (0) comprises a zeroth P-type CMOS transistor; the source electrode of the zeroth P-type CMOS transistor connected to the supply voltage and the grid electrode of the zeroth P-type CMOS transistor connected to the output terminal of the first buffer unit.

3. The POR circuit with zero steady-state current consumption and stable pull-up voltage according to claim 2, wherein, the band-gap comparator circuit (1) comprises a zeroth NPN-type bipolar transistor, a first NPN-type bipolar transistor, a first resistor, and a second resistor;
   the area of emitting electrode of the zeroth NPN-type bipolar transistor is smaller than the area of emitting electrode of the first NPN-type bipolar transistor;
   the emitting electrode of the zeroth NPN-type bipolar transistor is grounded, and the collector electrode and the base electrode of the zeroth NPN-type bipolar transistor is connected;
   the emitting electrode of the first NPN-type bipolar transistor is grounded, and the collector electrode and the base electrode of the first NPN-type bipolar transistor is connected;
   one terminal of the second resistor is connected to the drain electrode of the zeroth P-type CMOS transistor, and the other terminal of the second resistor is connected to the collector electrode of the zeroth NPN-type bipolar transistor;
   one terminal of the first resistor is connected to the base electrode of the zeroth NPN-type bipolar transistor, and the other terminal of the first resistor is connected to the base electrode of the first NPN-type bipolar transistor.

4. The POR circuit with zero steady-state current consumption and stable pull-up voltage according to claim 3, wherein, the current comparator circuit (2) comprises a current mirror, a fourth P-type CMOS transistor, a fifth N-type CMOS transistor, a sixth P-type CMOS transistor, and a transmission gate;
   the current mirror comprises a third P-type CMOS transistor, a fourth NPN-type bipolar transistor, and a fifth NPN-type bipolar transistor;
   the source electrodes of the third P-type CMOS transistor, the fourth P-type CMOS transistor, and the sixth P-type CMOS transistor are connected to the drain electrode of the zeroth P-type CMOS transistor respectively;
   the drain electrode and the grid electrode of the fourth P-type CMOS transistor is connected;
   the grid electrode of the third P-type CMOS transistor is connected to the common terminal between the grid electrode and the drain electrode of a second P-type CMOS transistor of the band-gap comparator circuit and the drain electrode of the third P-type CMOS transistor is connected to the collector electrode of the fourth NPN-type bipolar transistor and the grid electrode of the fifth N-type CMOS transistor;
   the base electrode of the fourth NPN-type bipolar transistor is connected to the collector electrode of the zeroth NPN-type bipolar transistor, and the emitting electrode of the fourth NPN-type bipolar transistor is grounded;
   the base electrode of the fifth NPN-type bipolar transistor is connected to the base electrode of the fourth NPN-type bipolar transistor, the emitter electrode of the fifth NPN-type bipolar transistor is grounded, and the collector electrode of the fifth NPN-type bipolar transistor is connected to the common terminal between the drain electrode and the grid electrode of the fourth P-type CMOS transistor;
   the grid electrode of the sixth P-type CMOS transistor is connected to the common terminal between the drain electrode and the grid electrode of the fourth P-type CMOS transistor, and the drain electrode of the sixth P-type CMOS transistor is connected to the drain electrode of the fifth N-type CMOS transistor and one terminal of the transmission gate;
   the source electrode of the fifth N-type CMOS transistor is grounded.

5. The POR circuit with zero steady-state current consumption and stable pull-up voltage according to claim 4, wherein, the state latch circuit (3) comprises a zeroth capacitor, a latch ring, a fourth inverter, a fifth inverter, a sixth inverter, a first inverter, and a fourteenth P-type CMOS transistor;
   one pole of the zeroth capacitor is connected to the supply voltage, and the other pole of the zeroth capacitor is connected to the input terminal of the fourth inverter and the input terminal of the latch ring respectively;
   the output terminal of the fourth inverter is connected to the input terminal of the fifth inverter, the output terminal of the fifth inverter is connected to the input terminal of the sixth inverter, and the output terminal of the sixth inverter is connected to the grid electrode of the fourteenth P-type CMOS transistor;
   the drain electrode of the fourteenth P-type CMOS transistor is connected to one terminal of the transmission gate, and the source electrode of the fourteenth P-type CMOS transistor is connected to the input terminal of the first inverter;
   the output terminal of the latch ring is connected to the input terminal of the first buffer unit;
   the output terminal of the first inverter is connected to the input terminal of the latch ring.

6. The POR circuit with zero steady-state current consumption and stable pull-up voltage according to claim 5, wherein, the brown out detector (4) comprises a ninth P-type CMOS transistor, a tenth N-type CMOS transistor, an eleventh N-type CMOS transistor, a twelfth N-type CMOS transistor, a thirteenth P-type CMOS transistor, and a second capacitor;

the source electrode of the thirteenth P-type CMOS transistor is connected to the supply voltage, and the common terminal between the grid electrode and the drain electrode of the thirteenth P-type CMOS transistor is connected to one pole of the second capacitor and the source electrode of the ninth P-type CMOS transistor;

the ninth P-type CMOS transistor and the tenth N-type CMOS transistor constitute an inverter, and the source electrode of the tenth N-type CMOS transistor and the other terminal of the second capacitor are grounded;

one terminal of the inverter is connected to the supply voltage, and the other terminal of the inverter is connected to the grid electrode of the eleventh N-type CMOS transistor and the grid electrode of the twelfth N-type CMOS transistor respectively;

the source electrode of the eleventh N-type CMOS transistor is grounded, and the drain electrode of the eleventh N-type CMOS transistor is connected to the output terminal of the latch ring;

the source electrode of the twelfth N-type CMOS transistor is grounded, and the drain electrode of the twelfth N-type CMOS transistor is connected to the source electrode of the fourteenth P-type CMOS transistor.

7. The POR circuit with zero steady-state current consumption and stable pull-up voltage according to claim 6, wherein, the latch ring comprises a second inverter and a third inverter;

the output terminal of the second inverter is connected to the input terminal of the third inverter, and the output terminal of the third inverter is connected to the input terminal of the second inverter.

* * * * *